(12) United States Patent
Ahn et al.

(10) Patent No.: US 11,657,736 B2
(45) Date of Patent: May 23, 2023

(54) DISPLAY DEVICE AND MANUFACTURING METHOD THEREOF

(71) Applicant: Samsung Display Co., Ltd., Yongin-si (KR)

(72) Inventors: Seong Sik Ahn, Yongin-si (KR); Ah-Ram Lee, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 185 days.

(21) Appl. No.: 17/328,820

(22) Filed: May 24, 2021

(65) Prior Publication Data

US 2021/0280096 A1    Sep. 9, 2021

Related U.S. Application Data

(62) Division of application No. 16/657,752, filed on Oct. 18, 2019, now abandoned.

(30) Foreign Application Priority Data

Nov. 19, 2018 (KR) .......................... 10-2018-0142462

(51) Int. Cl.
*H01L 51/56* (2006.01)
*G09F 9/30* (2006.01)
*H01L 51/52* (2006.01)

(52) U.S. Cl.
CPC .......... *G09F 9/301* (2013.01); *H01L 51/5246* (2013.01); *H01L 51/5253* (2013.01); *H01L 51/5281* (2013.01); *H01L 51/56* (2013.01); *H01L 2251/5338* (2013.01)

(58) Field of Classification Search
None
See application file for complete search history.

(56) References Cited

U.S. PATENT DOCUMENTS

| 11,251,395 | B2 * | 2/2022 | Sim .......................... B32B 9/041 |
| 2014/0045283 | A1 * | 2/2014 | Hirakata ............. H01L 51/0097 438/22 |
| 2016/0318293 | A1 * | 11/2016 | Kim .................... B32B 38/1841 |
| 2016/0372701 | A1 | 12/2016 | Kwon et al. |
| 2018/0183002 | A1 | 1/2018 | Kawata |
| 2019/0131362 | A1 | 5/2019 | Lee et al. |
| 2019/0181363 | A1 | 6/2019 | Lee et al. |
| 2021/0384428 | A1 * | 12/2021 | Jiang .................... H01L 27/3244 |

FOREIGN PATENT DOCUMENTS

| KR | 1020160149385 | 12/2016 |
| KR | 1020170093010 | 8/2017 |
| KR | 1020170133200 | 12/2017 |
| KR | 1020170137259 | 12/2017 |

* cited by examiner

*Primary Examiner* — Benjamin P Sandvik
(74) *Attorney, Agent, or Firm* — Cantor Colburn LLP

(57) ABSTRACT

A display device includes a window and a display panel attached to the window. The display panel includes a flat display area and a curved display area, and the curved display area may be thinner than the flat display area.

10 Claims, 16 Drawing Sheets

DISPLAY DEVICE AND MANUFACTURING METHOD THEREOF

This application is a divisional of U.S. patent application Ser. No. 16/657,752, filed on Oct. 18, 2019, which claims priority to Korean Patent Application No. 10-2018-0142462 filed on Nov. 19, 2018, and all the benefits accruing therefrom under 35 U.S.C. § 119, the content of which in its entirety is herein incorporated by reference.

BACKGROUND

(a) Field

Exemplary embodiments of this invention relate to a display device, and more particularly, to a display device including a curved display area, and a method for manufacturing the same.

(b) Description of the Related Art

A display device such as an organic light emitting display device, a light crystal display device, and the like is applied to an electronic device such as a smart phone, a portable phone, a multimedia terminal, and the like. A display device, particularly, a screen of a display device, is a portion exposed to an outside in the electronic device, and thus the display device is a key element in a design of the electronic device.

Unlike a cathode ray tube, a typically used display device is formed flat, and a screen is also formed flat. Recently, a flexible display device is being developed and thus the screen may have a curved surface rather than being limited to being flat. In particular, when the display device has curved edges, a screen-to-body ratio of the display device can be increased. The screen-to-body ratio reflects a technical level of a display device, and at the same time, is an important factor in product selection of a user. Thus, a development of a bezel-less display device having a screen-to-body ratio of one or close to one, that is, a display device of which only a screen is displayed when viewed from a front, is desired.

SUMMARY

Exemplary embodiments provide a display device having an increased screen-to-body ratio and a curved display area, and a method for manufacturing the display device.

An exemplary embodiment of a display device includes a window and a display panel attached to the window. The display panel includes a flat display area and a curved display area, and the curved display area is thinner than the flat display area.

In an exemplary embodiment, the curved display area may include a side display area that is disposed at at least one side of the flat display area and a corner display areas disposed at at least one corner of the flat display area.

In an exemplary embodiment, an edge of the corner display area and an edge of the side display area may be physically and continuously connected with each other.

In an exemplary embodiment, in a plan view, the edge of the corner display area may be a curved line and the edge of the side display area may be a straight line.

In an exemplary embodiment, the flat display area may have a rectangular shape, and the curved display area may include four side display areas that are respectively connected to four sides of the flat display area, and four corner display areas that are respectively disposed between adjacent side display areas among the four side display areas.

In an exemplary embodiment, in a plan view, an edge of each of the corner display areas may have an arc shape.

In an exemplary embodiment, the display device may further include an adhesive layer disposed between the window and the display panel.

In an exemplary embodiment, the display panel may further include a substrate, an organic light emitting diode on the substrate, an encapsulation layer covering the organic light emitting diode, and an anti-reflection layer on the encapsulation layer, and the anti-reflection layer may directly contact the adhesive layer.

In an exemplary embodiment, the curved display area may be in a stretched state.

In an exemplary embodiment, an edge of each of the curved display areas may be inclined with respect to an attachment surface of the curved display area.

An exemplary embodiment of a method for manufacturing a display device includes attaching an adhesive sheet to a rear side of a display panel, attaching a center area of the display panel to a window, attaching edge areas of the display panel to the window while a tension force is applied to the adhesive sheet, and removing the adhesive sheet.

In an exemplary embodiment, when the tension force is applied to the adhesive sheet, the adhesive sheet and the edges areas of the display panel attached to the adhesive sheet may be stretched, and the edge areas of the display panel may be attached to the window while being in a stretched state.

In an exemplary embodiment, the attaching the center area of the display panel may be carried out by a center pad, and the attaching the edge areas of the display panel may be carried out by edge pads that are disposed at edges of the center pad.

In an exemplary embodiment, the attaching the edge areas of the display panel may be carried out by increasing the volume of the edge pads.

In an exemplary embodiment, the edge pads may have moduli that are smaller than that of the center pad.

In an exemplary embodiment, at least one of the edge pads may be a diaphragm of which the volume is changed depending on an air pressure In an exemplary embodiment, the center pad may include a first pad and a second pad that surrounds the first pad. The attaching the center area of the display panel to the window may include attaching a first area of the center area by the first pad and then attaching a second area of the center area by the second pad.

In an exemplary embodiment, the attaching the center area of the display panel to the window may be carried out by a roll.

In an exemplary embodiment, the center area of the display panel may form a flat display area, and the edge areas of the display panel may form a curved display area that includes side display areas and corner display areas.

In an exemplary embodiment, when the adhesive sheet is attached to the rear side of the display panel, the adhesive sheet may be attached to the side display area and may not be attached to the corner display area.

In the exemplary embodiments, a display device having an increased screen-to-body ratio and a curved display area may be provided. In particular, the display device may have rounded corners and an image may be displayed on the corners, and the rounded corners may be smoothly and beautifully provided.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
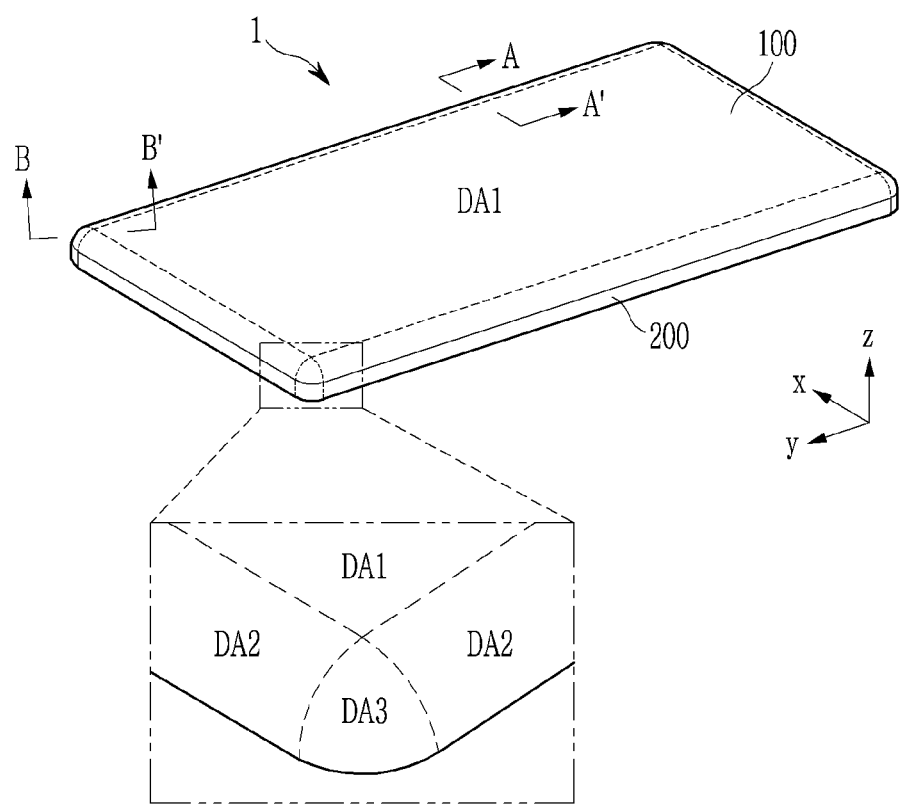
FIG. 1 is a schematic perspective of an exemplary embodiment of an electronic device to which a display device is applied.

Hereinafter, embodiments of the invention will be described in more detail with reference to the accompanying drawings. As those skilled in the art would realize, the described embodiments may be modified in various different ways, all without departing from the spirit or scope of the invention.

The drawings and description are to be regarded as illustrative in nature and not restrictive. Like reference numerals designate like elements throughout the specification.

In addition, the size and thickness of each configuration shown in the drawings are arbitrarily shown for better understanding and ease of description, but the invention is not limited thereto. In the drawings, the thickness of layers, films, panels, regions, etc., are exaggerated for clarity. In the drawings, for better understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

In this specification, the phrase "in a plan view" means viewing a target portion from the top, and the phrase "on a cross-section" means viewing a cross-section formed by vertically cutting a target portion from the side.

In the drawings, the symbol "x" used to indicate a direction denotes a first direction, "y" denotes a second direction that is perpendicular to the first direction, and "z" denotes a third direction that is perpendicular to the first direction and the second direction. The first direction (x), the second direction (y), and the third direction (z) may respectively correspond to a horizontal direction, a vertical direction, and a thickness direction of a display device.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Referring to FIGS. 1 to 6, an exemplary embodiment of a display device will now be described.

Referring to FIG. 1, a display device 100 according to an exemplary embodiment may be applied to an electronic device 1 such as a smart phone, a portable phone, a tablet, a multimedia player, a game machine, and the like. The electronic device 1 may include the display device 100 and a housing 200. The display device 100 provides a screen where an image is displayed in the electronic device 1. The housing 200 may also referred to as a set frame, and may fix the display device 100. Several parts that form the electronic device 1 are provided in an internal space limited by the display device 100 and the housing 200. In an exemplary embodiment, a processor, a memory, a battery, a driving apparatus, a camera, a speaker, a microphone, a receiver, a communication module, various sensors, and the like may be disposed in the electronic device 1, for example.

The entire front surface of the electronic device 1 may correspond to the screen, and at least a part of the side surface of the electronic device 1 may correspond to the screen. The screen corresponds to display areas DA1, DA2, and DA3 of the display device 100. The display areas DA1, DA2, and DA3 include a front display area DA1 that is disposed at the front surface, side display areas DA2 that are disposed at at least two sides of the front display area DA1, and corner display areas DA3 that are disposed at corners of the front display area DA1. The front display area DA1 is disposed at a center of the display device 100, and may occupy almost the entire screen. The side display areas DA2 and the corner display areas DA3 are disposed at the peripheries of the front display area DA1. The side display areas DA2 and the corner display areas DA3 are referred to as a peripheral display area.

The front display area DA1 may occupy the largest area along the display areas DA1, DA2, and DA3, and may form a substantially flat screen. The front display area DA1 may be referred to as a flat display area. In a plan view, the front display area DA1 may have a rectangular shape having four sides. Corners of the front display area DA1 may be sharp as shown in the drawing, or may be rounded. Four sides of the front display area DA1 may respectively extend in a first direction x or a second direction y.

The side display areas DA2 may include four areas that are respectively connected to the top, bottom, left, and right sides of the front display area DA1, or may include only some of the four sides. A screen of each of the side display areas DA2 forms a curved surface, and a curvature may be constant or changed depending on locations of the curved surface. Each of the side display areas DA2 may have a shape that is similar to a part (e.g., ¼) of a side surface of a substantially curved column such as an elliptical column or a cylinder.

The corner display areas DA3 are located at four corners or some of the corners of the display device 100, and between two adjacent display areas DA2. A screen of each corner display area DA3 is curved, and a curvature thereof may be constant or changed depending on locations of the curved surface. A shape of the curved surface of the corner display area DA3 may be different from that of the side display area DA2. In an exemplary embodiment, each corner display area DA3 may have a shape that is similar to a part (e.g., ⅛) of a substantially curved figure such as a sphere or an elliptical sphere, for example.

When the electronic device 1 is viewed from the front, the entire front display area DA1, the side display areas DA2, and a part of the corner display areas DA3 are combined and thus may be recognized as a rectangular screen having rounded corners. The housing 200 is not seen or is hardly seen, and a substantially bezel-less electronic device 1 of which a screen ratio is almost one may be realized.

Figure 2:
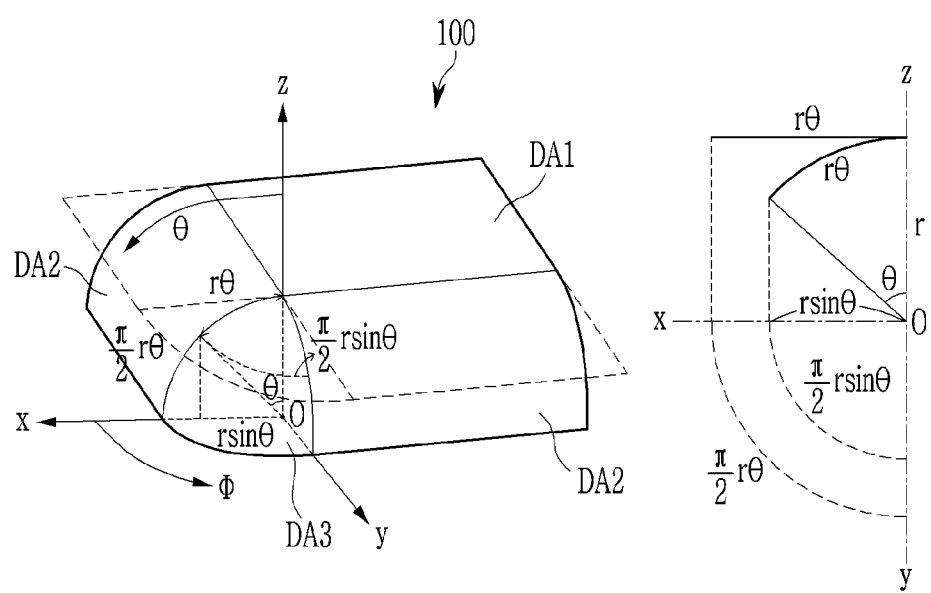
FIG. 2 shows an exemplary embodiment of a shape of a rounded corner of the display device by a geometric display part.

Referring to FIG. 2, a location of the corner display area DA3 on a screen (or may be referred to as a curved surface) may be represented with a polar coordinate system, which may be represented by a curvature radius r based on the origin (0) shown in the drawing, an angle θ defined with a third direction (z) (also referred to as a polar angle, with a unit of radians), and an angle φ (also referred to as an azimuth, with a unit of radians) defined by projection onto the xy plane, which is a plane provided by the first direction x and the second direction y, and the first direction x. Here, the curvature radius r may be constant, or may be changed depending on locations of the corner display area DA3 on a curved surface or on the screen.

Figure 3:
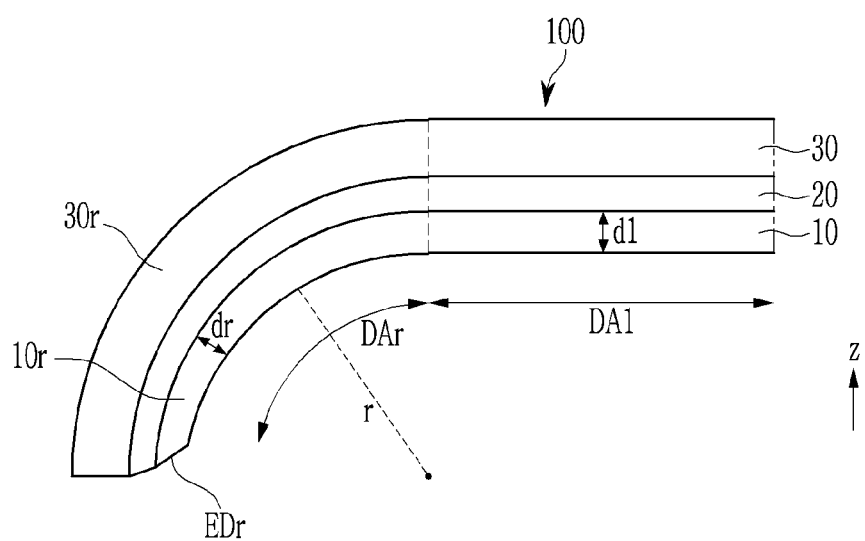
FIG. 3 is a schematic cross-sectional view of an exemplary embodiment of the display device.

Referring to FIG. 3, a cross-sectional view of the display device 100 according to the exemplary embodiment is illustrated. The cross-sectional view of FIG. 3 may correspond to a cross-section of FIG. 1, taken along line A-A' and/or B-B'. The display device 100 includes a display panel 10, an adhesive layer 20, and a window 30.

At least a part of the display panel 10 may be flexible. Pixels are arranged on a substrate in the display panel 10, and an image is displayed by a combination of the pixels. Pixels including red pixels, green pixels, and blue pixels are arranged not only in the front display area DA1 but also in the side display areas DA2 and the corner display areas DA3. Signal lines that transmit signals for driving the pixels are disposed in the display panel 10. The display panel 10 may be a light emission display panel that includes light emitting elements. The display panel 10 may include a touch sensor layer that may sense a touch.

The window 30 is a type of a cover that protects the display panel 10 from external impact. The window 30 may serve as a support that maintains a curved state of the display panel 10. The window 30 may include a transparent and solid material such as glass or plastic such that a user may see an image displayed on the screen of the display panel 10.

The display panel 10 is attached to the window 30 by the adhesive layer 20 that includes an adhesive such as an optically clear adhesive ("OCA"), an optically clear resin ("OCR"), a pressure sensitive adhesive ("PSA"), and the like.

The display device 100 is substantially flat in the front display area DA1, and the side display areas DA2 and the corner display areas DA3 are curved with a curvature. A curvature, that is, a curvature radius r, may be constant or variable depending on locations. As described, such a bent display area is referred to as a curved display area DAr. The curved display area DAr includes the side display areas DA2 and the corner display areas DA3. Corresponding to the curved display area DAr, the display panel 10 includes a bent edge area 10r and the window 30 includes a bent edge area 30r.

In the display device 100, an image is displayed by the display panel 10, and the window 30 transmits an image displayed on the display panel 10 while covering the display panel 10. Thus, a front display area DA1, side display areas DA2, and corner display areas DA3 of the display device 100 may be described as the same concept as the front display area DA1, the side display areas DA2, and the corner display area DA3 of the display panel 10, respectively.

A thickness dr of the curved display area DAr (corresponding to, the edge area 10r) of the display panel 10 may be smaller than a thickness dl of the front display area DA1 of the display panel 10. This may be because the front display area DA1 of the display panel 10 is not stretched or is in a hardly stretched state, and the curved display area DAr is in a stretched state. An edge EDr of the curved display area DAr of the display panel 10 may be obliquely provided. This is because when the curved display area DAr of the display panel 10 is in a stretched state, the curved display area DAr tends to be restored to its original state. In this case, one side of the curved display area DAr is attached to the window 30 by the adhesive layer 20 and thus the one side may not contract or rarely contract, and the other side may slightly contract. Therefore, due to asymmetric contraction (or restoration) at opposite sides of the curved display area DAr, the edge EDr of the curved display area DAr may be inclined like an edge of a chisel rather than being approximately perpendicular to the attached side of the curved display area DAr.

Figure 4:
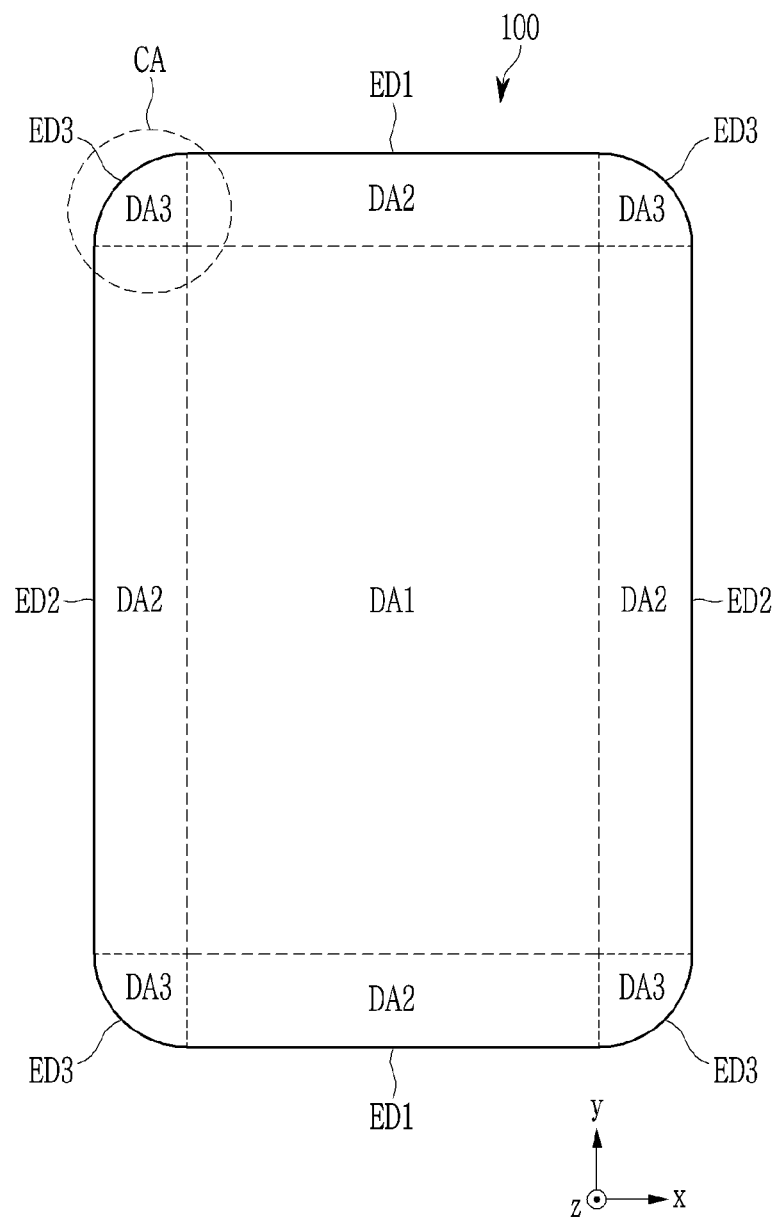
FIG. 4 is a plan view of an exemplary embodiment of the display device.
Figure 5:
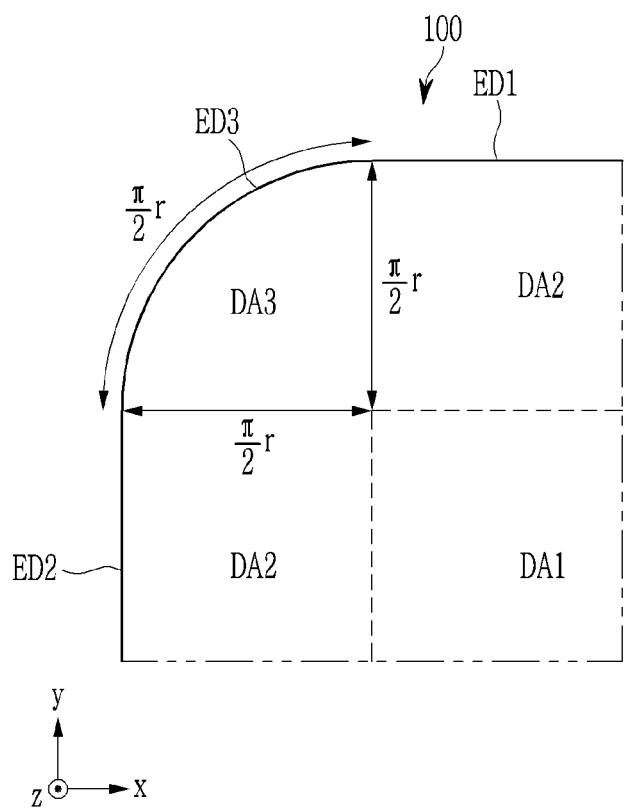
FIG. 5 is a partially enlarged view of the display device of FIG. 4.

Referring to FIGS. 4 and 5, when viewed from the front, the display device 100 includes the front display area DA1, the side display areas DA2 that are disposed at at least two sides of the front display area DA1, and the corner display areas DA3. The corner display areas DA3 may be disposed between two neighboring side display areas DA2 while contacting the side display areas DA2. The side display areas DA2 and the corner display areas DA3 form curved sides by being curved with a curvature as previously described.

The side display area DA2 and the corner display area DA3 may be wholly stretched and/or contracted. That is, the area of the side display area DA2 and the area of the corner display area DA3 may be extended or reduced depending on a force applied thereto. The side display area DA2 may be wholly stretched and/or contracted to the same extent as the corner display area DA3, and may have less elongation and/or contraction than the corner display area DA3. The front display area DA1 may have the same extent of elongation and/or contraction as the corner display area DA3 or the side display area DA2, and or the extent of elongation and/or contraction of the front display area DA1 may be less than that of the corner display area DA3 or the side display area DA2. In an exemplary embodiment, the front display area DA1 may have flexibility and thus may have a fixed form, or may be bent, but may not substantially have an elongation property and/or a contraction property to increase or reduce its area, for example.

In a plan view, an edge, which is an edge of the display device 100, may include edges ED1 and ED2, which are edges of the side display areas DA2, and edges ED3, which are edges of the corner display areas DA3. Each of the edges ED1 and ED2 of the side display area DA2 may substantially be straight lines extending in the first direction x or the second direction y, and the edge ED3 of the display corner DA3 may substantially be a curved line. The edge ED3 of the corner display area DA3 may be a part of a circle having a constant curvature radius, or may be provided in the shape of an arc. The edge ED3 of the corner display area DA3 may be a curved line having a variable curvature radius. Opposite ends of the edge ED3 may be connected with the edges ED1 and ED2 of the two side display areas DA2.

A boundary between the side display area DA2 and the front display area DA1 may also substantially be a straight line, and the corner display area DA3 may be connected to a corner of the front display area DA1.

At boundaries of the front display area DA1 and the side display area DA2, the front display area DA1 and the side display areas DA2 may include one physically continuous substrate and layers stacked on the substrate. Similarly, at boundaries of the corner display areas DA3 and the side display areas DA2 and/or the front display area DA1, the corner display area DA3 may include one substrate that is physically continuous to the side display area DA2 and/or the front display area DA1 and layers stacked on the substrate. In an alternative exemplary embodiment, the front display area DA1 and the side display areas DA2 may include individual substrates and layers stacked on the individual substrates. In addition, the corner display area DA3 and the side display area DA2 and/or the front display area DA1 may include individual substrates and layers stacked on the individual substrates.

When the corner display areas DA3 and the side display areas DA2 include one physically continuous substrate, the edges ED3 may be physically continuously connected with the edges ED1 and ED2. When the front display area DA1 and the side display areas DA2 include individual substrates and stacked layers, the two substrates and the stacked layers may be in a state of being bonded to each other, and when the corner display areas DA3 and the side display areas DA2 include individual substrates and stacked layers, the two substrates and the stacked layers may be in a state of being bonded to each other.

Referring to FIGS. 2 and 5, when a curvature radius of the side display area DA2 and the corner display area DA3 is denoted as r, a length of the edge ED3 of the corner display area DA3 may be about $\pi r/2$. A curvature distance from the edges ED1 and ED2 to a boundary (hereinafter, simply referred to as a boundary of the front display area DA1) between the front display area DA1 and the side display area DA2 may be about $\pi r/2$ on the curved surface or the screen of the side display area DA2.

Figure 6:
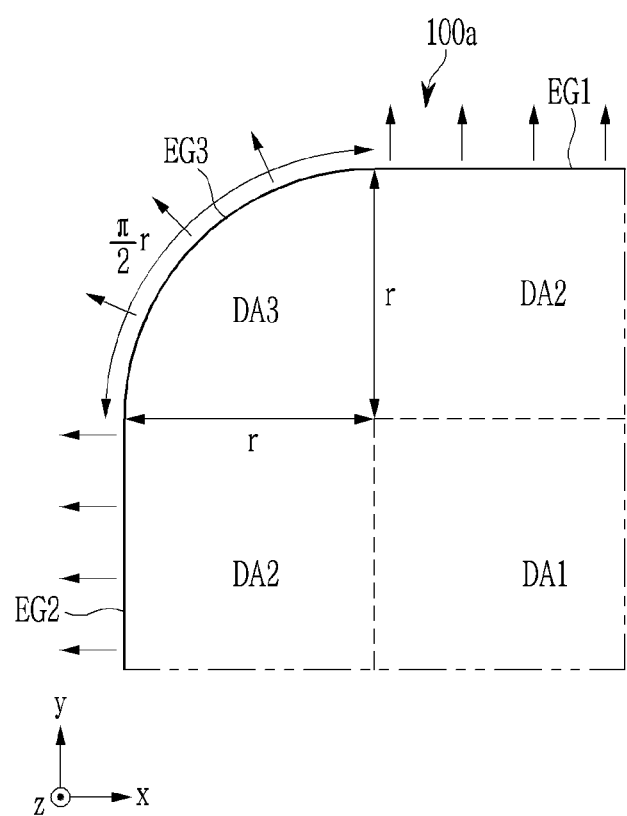
FIG. 6 is a developed view of the display device of FIG. 5 before edge areas of the display are bent.

FIG. 6 shows one corner CA (refer to FIG. 4) of a display device 100a before the side display area DA2 and the corner display area DA3 of the display device 100 are bent to be curved, and is a developed view on a two-dimensional plane.

That is, the side display area DA2 and the corner display area DA3 shown in FIG. 6 are in a planar state before being curved, and may be referred to as being in a flat state. In the following description, the flat state also means a state before the edge area of the display device is bent to a curved surface or a state in which the curved surface is stretched and contracted again.

Compared to FIG. 5, which shows a state that the side display area DA2 and the corner display area DA3, which are edge areas of the display device, are bent, referring to FIG. 6, while the side display area DA2 and the corner display area DA3 are in a flat state, a length of an edge EG3 of the corner display area DA3 may be about $\pi r/2$, and a planar distance from edges EG1 and EG2 of the side display areas DA2 to a boundary between the front display area DA1 and the side display area DA2 may be about r.

Here, ED1, ED2, and ED3 denote edges of the side display areas DA2 and the corner display area DA3 while the side display area DA2 and the corner display area DA3, which are edge areas of the display device, are bent into a curved state, and EG1, EG2, and EG3 denote edges of the side display area DA2 and the corner display area DA3 while the side display areas DA2 and the corner display area DA3 are in a flat state before being bent.

The lengths of the edge EG3 of the corner display area DA3 in the flat state and the edge ED3 of the curved corner display area DA3 may both be about $\pi r/2$. A distance between the edge EG3 of the corner display area DA3 in a flat state and a boundary of the front display area DA1 equals the curvature radius r, but a curvature distance between the edge ED3 of the corner display area DA3 which may be bent to be curved, and the boundary of the front display area DA1, may be equal to $\pi r/2$, as previously described. Similarly, a distance between the edges EG1 and EG2 of the side display areas DA2 in a flat state and the boundary of the front display area DA1 equals the curvature radius r, but a curvature distance between the edges ED1 and ED2 of the side display areas DA2, which are bent to be curved, and the boundary of the front display area DA1, may be equal to $\pi r/2$, as previously described.

Accordingly, as indicated by the arrows that face the outside in FIG. 6, the side display area DA2 and the corner display area DA3 need to be stretched to the outside from the front display area DA1 as the edge areas of the display device are bent. In an exemplary embodiment, the side display area DA2 disposed at the left side with reference to the front display area DA1 is stretched to the left, and the side display area DA2 disposed in an upper side is stretched upward, while the corner display areas DA3 are stretched radially outwards in the radial direction, for example. Through such a process, a curvature distance (i.e., the shortest distance) from the respective edges EG1, EG2, and EG3 to the boundary of the front display area DA1 in the side display areas DA2 and the corner display areas DA3 is stretched to be $\pi r/2$ starting from r as shown in FIG. 5 in a state that is bent to be curved as shown in FIG. 6, and thus the side display areas DA2 and the corner display areas DA3 have curved display surfaces. That is, during a process for manufacturing the display device 100, the area of the side display area DA2 and the area of the corner display area DA3 are increased while the edge areas of the display panel 10 are bent.

Hereinafter, the display device according to the exemplary embodiment has been described. Hereinafter, a method for manufacturing the display device 100, specifically a method for laminating the display panel 10 on the window 30, will be described with reference to FIGS. 7 to 10, 11 to 13, 14 and 15. In order to describe a corresponding relationship with the above-described display device 100, FIGS. 1 to 6 will also be referred to even when not specifically mentioned.

Figure 7:
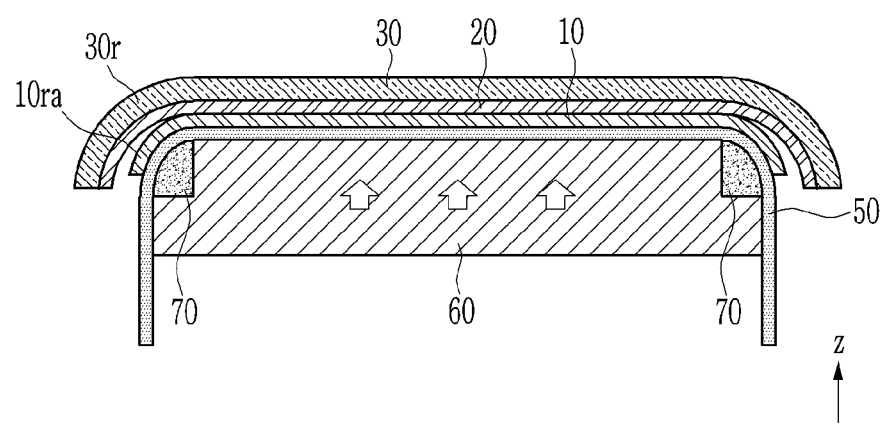
FIGS. 7, 8, 9 and 10 show an exemplary embodiment of a method for manufacturing a display device.
Figure 8:
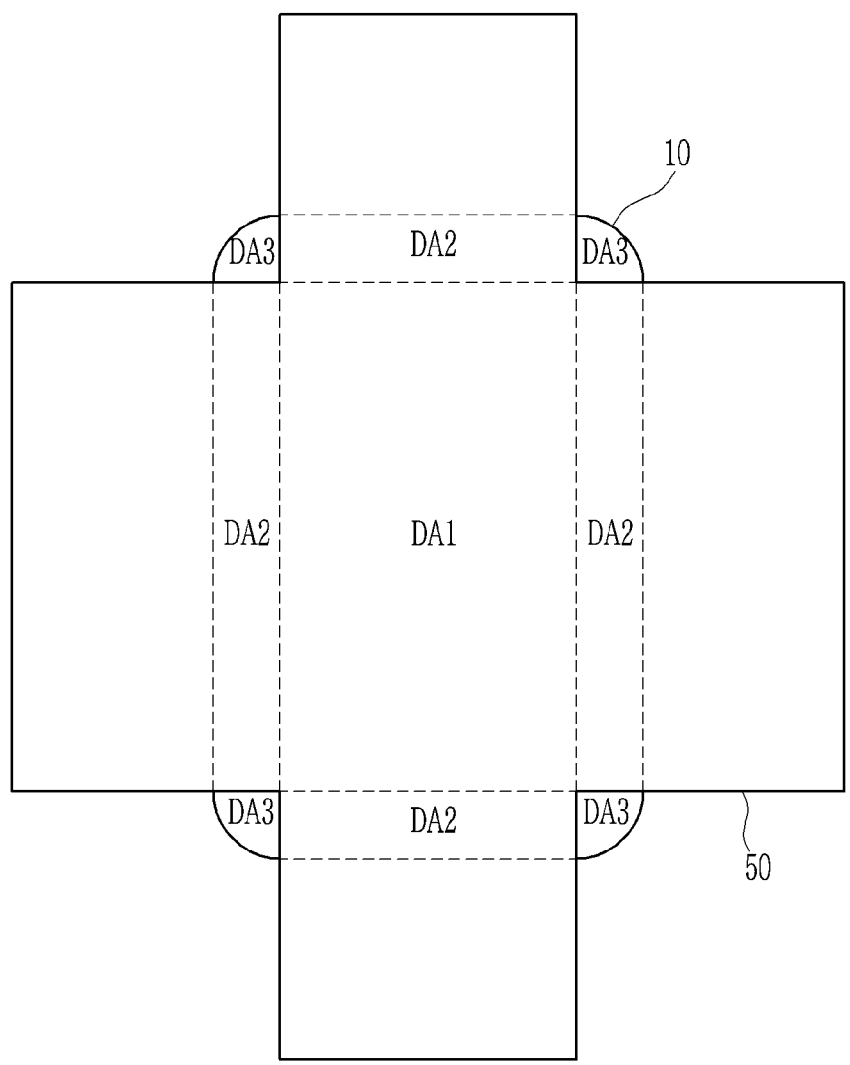
Figure 9:
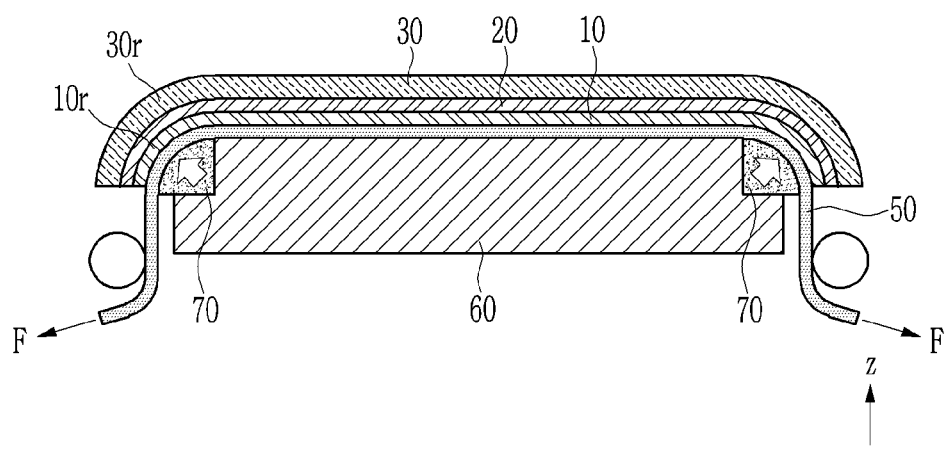
Figure 10:
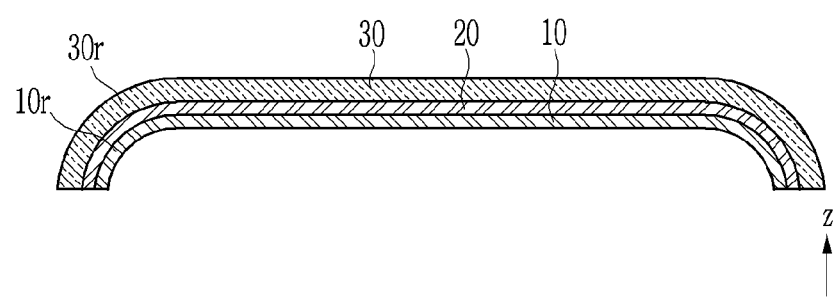

FIGS. 7, 9 and 10 are process cross-sectional views that show an exemplary embodiment of a method for manufacturing a display device, while FIG. 8 shows a state in which an adhesive sheet 50 is attached to a display panel, and the adhesive sheet 50 is attached to the display panel before edge areas of the display panel are bent.

Referring to FIG. 7, a lamination device may include a pad portion that includes a center pad 60 and edge pads 70 that are disposed at edges of the center pad 60. Although it is not illustrated, a jig may be disposed below the pad portion.

The center pad 60 may have a high modulus, and the edge pad 70 may have a low modulus. The modulus of the edge pad 70 is lower than that of the center pad 60, and thus the shape of the edge pad 70 may be easily changed. The edge pad 70 may be located along an edge of an upper portion of the center pad 60. The edge pad 70 may include or be connected with an air pump such that the shape and volume of the edge pad 70 may be changed depending on air pressure. That is, the edge pad 70 may be a diaphragm. The center pad 60 may be substantially used to attach the front display area DA1, and the edge pads 70 may be used to attach the side display areas DA2 and the corner display areas DA3.

Regarding the lamination process, an adhesive layer 20 is provided at a rear side of the window 30. The adhesive layer 20 may be provided by attaching a film-type adhesive such as an OCA, a PSA, and the like to the rear side of the window 30, or may be provided by coating an adhesive such as an OCR. The window 30 includes an edge area 30r that is bent to form a curved surface, and the adhesive layer 20 is also provided in the edge area 30r. In the lamination process, the window 30 may be in a state of being fixed to a jig and the like, and lamination may be carried out in a vacuum chamber.

Next, the display panel 10 to which the adhesive sheet 50 is attached to the rear side thereof is placed on the pad portion. Referring to FIG. 8, the adhesive sheet 50 may be attached to the front display area DA1 and the side display areas DA2 of the display panel 10. The adhesive sheet 50 may not be attached to the corner display areas DA3 of the display panel 10. The adhesive sheet 50 may be large enough to completely cover the side display areas DA2 and extend to the outside the side display areas DA2.

When the edge pad 70 has higher elasticity than the center pad 60, the adhesive sheet 50 may be pulled downward (i.e., in a −z direction) such that the edge pad 70 may have a minimum volume. In this case, edge areas of the display panel 10 may not substantially extend, and may form curved edge areas 10ra. When the edge pad 70 includes or is connected with an air pump, the edge pad 70 may be in a state of having a low or minimum volume with a low or minimum air pressure.

Next, the center pad 60 is lifted to make a center area of the display panel 10 contact the adhesive layer 20 and then attached to the window 30. In this case, a direction of the adhesive sheet 50 may be adjusted to avoid the edge areas 10ra of the display panel 10 from contacting the adhesive layer 20. The center area of the display panel 10 may correspond to the front display area DA1. The center pad 60 may be lifted by lifting the jig disposed below the pad portion.

Referring to FIG. 9, the volume of the edge pad 70 is increased while a tension force F is applied to the adhesive sheet 50. When the tension force F is applied to the adhesive sheet 50, the adhesive sheet 50 is stretched (or expanded). Since the edge areas 10ra of the display panel 10 are attached to the adhesive sheet 50, the edge areas 10ra (refer to FIG. 7) are stretched as the adhesive sheet 50 is stretched such that the edge area 10r that forms the side display area DA2 and a curved side of the corner display area DA3 may be provided. The corner display area DA3 of the display panel 10 may be stretched as the side display area DA2 that contacts the corner display area DA3 is stretched even when the corner display area DA3 is not attached to the adhesive sheet 50. Since the side display area DA2 and the corner display area DA3 are provided by expansion, a smooth and stereoscopic edge area 10r may be provided. Thus, the rounded corner display areas DA3 that is located at the corners of the display device 100 may be smoothly and beautifully provided, and the corner display areas DA3 may match the curved edge areas 30r of the window 30.

When the volume of the edge pad 70 is increased, the edge area 10r of the display panel 10 contacts the adhesive layer 20 and thus is closely attached to the adhesive layer 20 such that the edge area 10r may be attached to the edge area 30r of the window 30.

Regarding the volume increase of the edge pad 70, when the edge pad 70 is provided as a diaphragm, the volume of the edge pad 70 may be increased by increasing air pressure of the edge pad 70. Accordingly, the edge area 10r of the display panel 10 may be closely attached to the adhesive layer 20, and the edge area 10r of the display panel 10 may be attached to the edge area 30r of the window 30. When the edge pad 70 has higher elasticity than the center pad 60, a direction of pulling the adhesive sheet 50 may be adjusted as the volume of the edge pad 70 is increased.

A tension force F applied to the adhesive sheet 50 may be applied until the edge areas 10r of the display panel 10 are attached to the window 30. In order to prevent deformation of a center area of the display panel 10 attached to the window 30, the center pad 60 may be in a state of being closely attached to the center area of the display panel 10 when attaching the edge areas 10r of the display panel 10 to the window 30.

Referring to FIG. 10, after the display panel 10 is attached to the window 30, the adhesive sheet 50 attached to the rear side of the display panel 10 is detached such that the display device 100, in a state that the display panel 10 is attached to the window 30 by the adhesive layer 20, may be manufactured. In order to easily remove the adhesive sheet 50, an attachment side of the adhesive sheet 50 may include an adhesive of which viscosity is deteriorated when ultraviolet ("UV") or heat is applied thereto.

Regarding the adhesive layer 20, a process for forming the adhesive layer 20 at a rear side of the window 30 and attaching the display panel 10 to the window 30 has been described, but the adhesive layer 20 may be provided at a front side of the display panel 10.

A method for manufacturing a display device according to another exemplary embodiment will now be described, and differences from the above-described embodiment will be mainly described.

Figure 11:
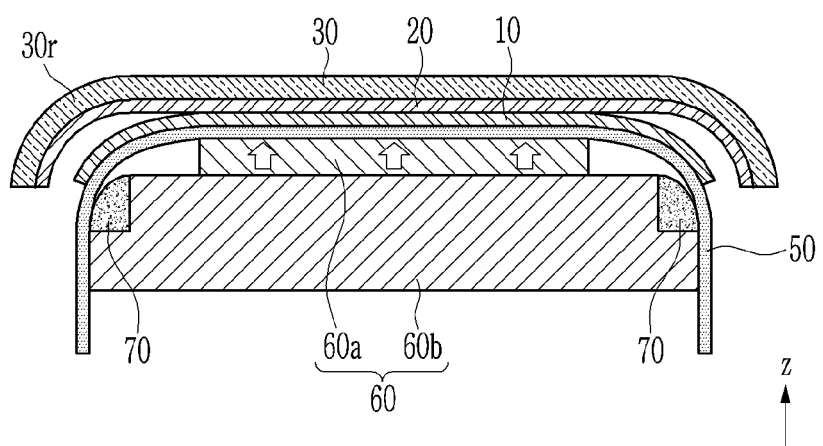
FIGS. 11, 12 and 13 show an exemplary embodiment of a method for manufacturing a display device.
Figure 12:
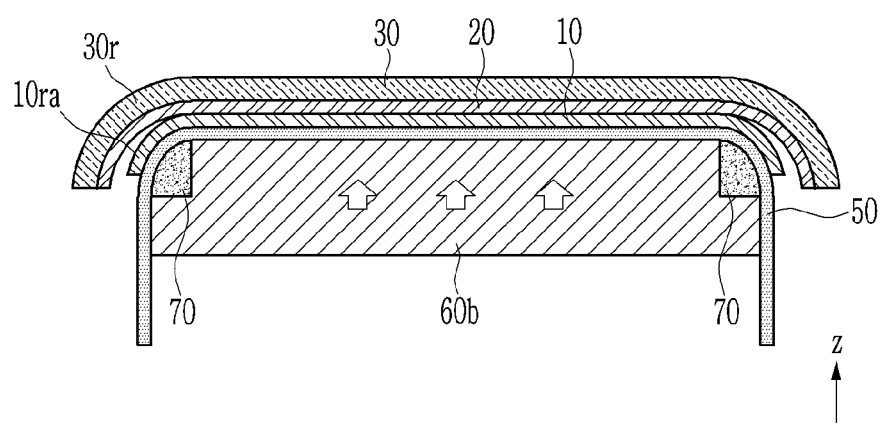
Figure 13:
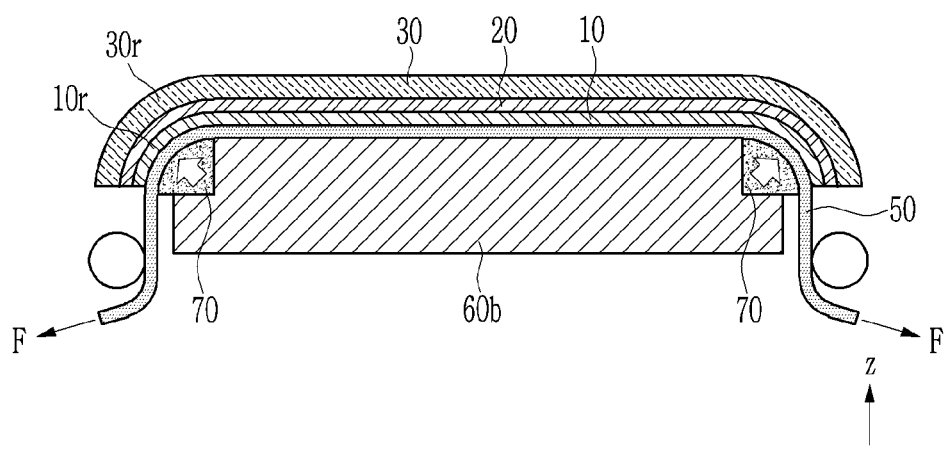

FIGS. 11, 12 and 13 show an exemplary embodiment of a method for manufacturing a display device.

Referring to FIGS. 11 and 12, a center pad 60 includes a first pad 60a and a second pad 60b. The first pad 60a is disposed closer to a center than the second pad 60b is to the center, and the second pad 60b may surround the first pad 60a.

A center area of a display panel 10, which may correspond to a front display area DA1, is not attached to the window 30 at one time, but a first area is attached first and then a second area is attached. Referring to FIG. 11, the display panel 10 where an adhesive sheet 50 is attached to a rear side thereof is placed on a pad portion, and then the first pad 60a is lifted to contact the first area among the center area of the display panel 10 and the adhesive layer 20 and then is attached to the window 30. Next, referring to FIG. 12, the second pad 60b is lifted to contact the second area among the center area of the display panel 10 and the adhesive layer 20 and then is attached to the window 30. The first pad 60a may maintain the lifted state when the second area is attached by the lifting of the second pad 60b, but may be lowered. When the second pad 60b is disposed to surround the first pad 60a, the second area of the display panel 10 may surround the first area.

Next, referring to FIG. 13, stretched edge areas 10r of the display panel 10 may be attached to edge areas 30r of the window 30 by increasing the volume of the edge pads 70 while applying a tension force F to the adhesive sheet 50 by the same method as described above with reference to FIG. 9. After lamination is carried out, the adhesive sheet 50 may be removed.

As described, occurrence of a fault such as bubbles or wrinkles may be reduced by attaching the center area of the display panel 10 in stages by making the center pad 60 multi-stepped. The center pad 60 is described as a two-stepped pad including the first pad 60a and the second pad 60b, but the center pad 60 may include three or more stepped pads.

Figure 14:
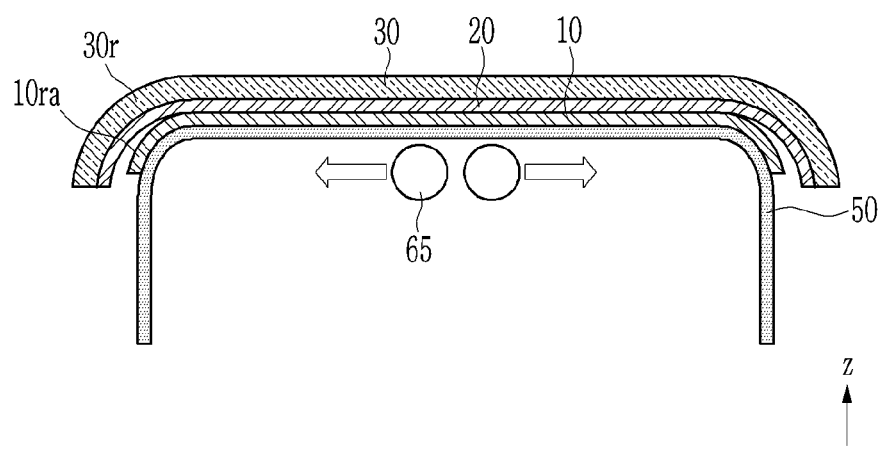
FIGS. 14 and 15 show an exemplary embodiment of a manufacturing method of a display device.
Figure 15:
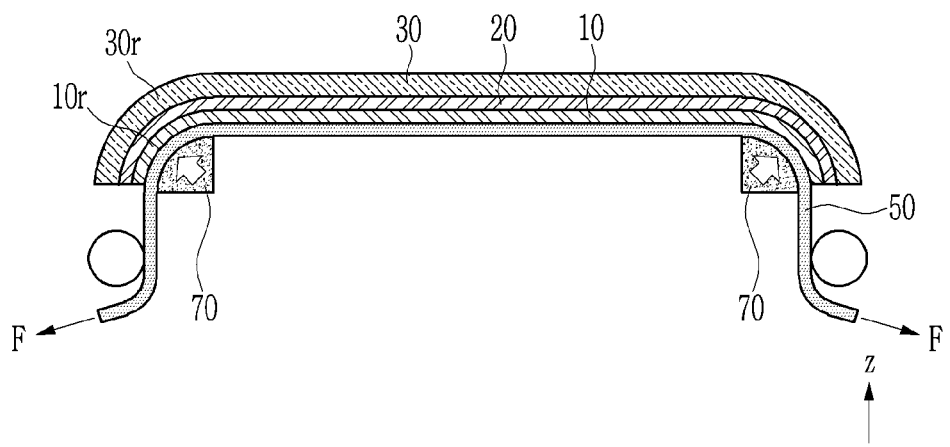

FIGS. 14 and 15 show an exemplary embodiment of a manufacturing method of a display device.

Referring to FIG. 14, when a center area of a display panel 10, corresponding to a front display area DA1, is attached to a window 30, a roll 65 is used instead of a pad. Since the front display area DA1 is a flat area, the center area of the display panel 10 may be attached to the window 30 by a roll lamination method. In the drawing, two rolls 65 are shown, but a lamination device may include less than two rolls, or three or more rolls may be included in attachment of the center area of the display panel 10 to the window 30.

Referring to FIG. 15, by the same method as described above with reference to FIG. 9, stretched edge areas 10r of the display panel 10 may be attached to edge areas 30r of the window 30 by increasing the volume of edge pads 70 while a tension force F is applied to an adhesive sheet 50. After lamination is carried out, the adhesive sheet 50 may be removed.

Hereinafter, a configuration of a display panel that may be included in a display device according to an exemplary embodiment will be described with reference to FIG. 16.

Figure 16:
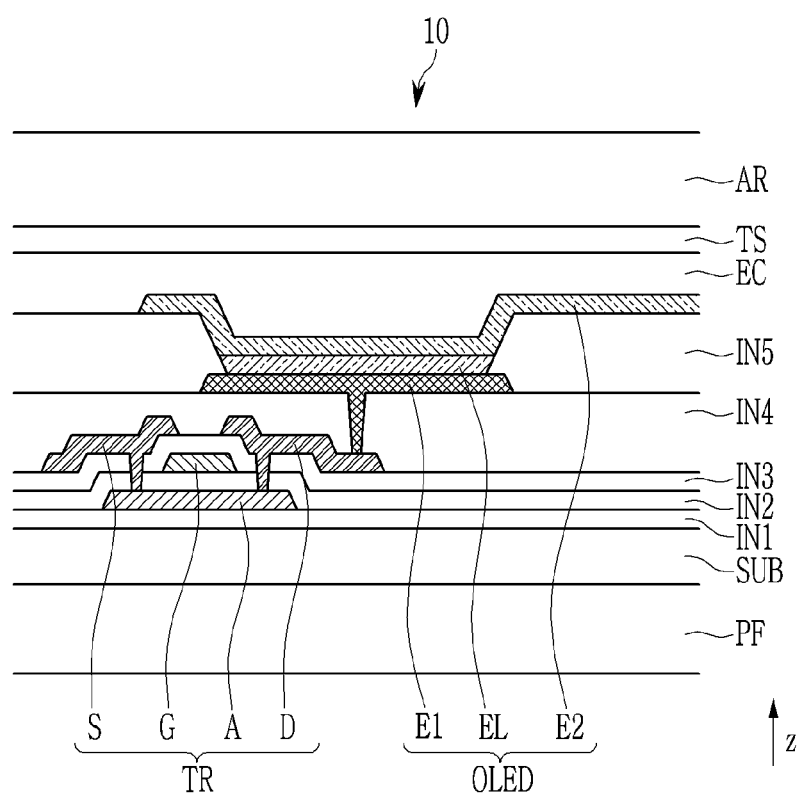
FIG. 16 is a cross-sectional view of an exemplary embodiment of a display panel.

FIG. 16 is a cross-sectional view of an exemplary embodiment of a stacked structure of a display panel. A cross-section shown in FIG. 16 may substantially correspond to one pixel area.

A display panel 10 basically includes a substrate SUB, a transistor TR disposed on the substrate SUB, and an organic light emitting diode OLED that is connected to the transistor TR.

The substrate SUB may be a flexible substrate including a polymer such as polyimide ("PI"), polyamide ("PA"), polyethylene terephthalate ("PET"), and the like. The substrate SUB may include a barrier layer that prevents permeation of moisture, oxygen, and the like from an external environment. In an exemplary embodiment, the substrate SUB may include one or more polymer layers and one or more barrier layers, and the polymer layers and the barrier layers may be alternately stacked, for example.

A first insulation layer IN1 is disposed on the substrate SUB. The first insulation layer IN1 may also be referred to as a buffer layer, and may serve to block an impurity that may be dispersed into a semiconductor layer A from the substrate SUB and reduce a stress applied to the substrate SUB during a process for forming the semiconductor layer A. The barrier layer and the first insulation layer IN1 may include an inorganic insulation material such as a silicon oxide, a silicon nitride, and the like.

The semiconductor layer A of the transistor TR is disposed on the first insulation layer IN1, and a second insulation layer IN2 is disposed on the semiconductor layer A. The semiconductor layer A includes a source region and a drain region, and a channel region disposed between the source region and the drain region. The semiconductor layer A may include a semiconductor material such as polysilicon, an oxide semiconductor, amorphous silicon, and the like. The second insulation layer IN2 may also be referred to as a gate insulation layer, and may include an inorganic insulating material.

A gate conductor that includes a gate electrode G of the transistor TR is disposed on the second insulation layer IN2. In an exemplary embodiment, the gate conductor may include a metal such as molybdenum (Mo), copper (Cu), aluminum (Al), silver (Ag), chromium (Cr), tantalum (Ta), titanium (Ti), and the like, or a metal alloy.

A third insulation layer IN3 is disposed on the gate conductor. The third insulation layer IN3 may be referred to as an interlayer insulation layer, and may include an inorganic insulating material.

A data conductor that includes a source electrode S and a drain electrode D of the transistor TR is disposed on the third insulation layer IN3. The source electrode S and the drain electrode D are respectively connected with the source region and the drain region of the semiconductor layer A through contact holes that are respectively defined in the third insulation layer IN3 and the second insulation layer IN2. In an exemplary embodiment, the data conductor may include a metal such as aluminum (Al), copper (Cu), silver (Ag), molybdenum (Mo), chromium (Cr), gold (Au), platinum (Pt), palladium (Pd), tantalum (Ta), tungsten (W), titanium (Ti), nickel (Ni), and the like, or a metal alloy.

A fourth insulation layer IN4 is disposed on the data conductor. The fourth insulation layer IN4 may also be referred to as a planarization layer or a passivation layer, and may include an organic insulating material.

A first electrode E1 is disposed on the fourth insulation layer IN4. The first electrode E1 may also be referred to as a pixel electrode. The first electrode E1 is connected with the drain electrode D through a contact hole defined in the fourth insulation layer IN4, and thus may receive a data signal that controls luminance of the organic light emitting diode OLED.

A fifth insulation layer IN5 is disposed on the fourth insulation layer IN4. The fifth insulation layer IN5 may also be referred to as a pixel definition layer, and an opening that overlaps the first electrode E1 is defined in the fifth insulation layer IN5. An emission layer EL is disposed above the first electrode E1 in the opening of the fifth insulation layer IN5, and a second electrode E2 is disposed on the emission layer EL. The second electrode E2 may also be referred to as a common electrode.

The first electrode E1, the emission layer EL, and the second electrode E2 form a light emitting element, e.g., an organic light emitting diode OLED. The first electrode E1 may be an anode of the organic light emitting diode OLED, and the second electrode E2 may be a cathode of the organic light emitting diode OLED.

An encapsulation layer EC is disposed on the second electrode E2. The encapsulation layer EC may prevent permeation of moisture or oxygen from an external environment by encapsulating the organic light emitting diode OLED. The encapsulation layer EC may include one or more inorganic material layers and one or more organic material layers, and the inorganic material layer and the organic material layer may be alternately stacked.

A touch sensor layer TS may be disposed on the encapsulation layer EC. The touch sensor layer TS may include touch electrodes including a transparent conductive material, a metal mesh, and the like, and the touch electrodes may be provided as a single layer or as multiple layers. The touch sensor layer TS may be disposed directly on the encapsulation layer EC, or may be separately provided and thus attached on the encapsulation layer EC.

An anti-reflection layer AR may be disposed on the touch sensor layer TS to reduce reflection of external light. The anti-reflection layer AR may include a polarization layer. Without separately forming the anti-reflection layer AR, an anti-reflection effect may be obtained by forming the encapsulation layer EC and/or the touch sensor layer TS with a refractive index matching structure.

In the display panel 10, the anti-reflection layer AR may be a layer that directly contacts the above-described adhesive layer 20. When the display panel 10 does not include the anti-reflection layer AR, the touch sensor layer TS may be a layer that directly contacts the adhesive layer 20. When the display panel 10 does not include the anti-reflection layer AR and the touch sensor layer TS, the encapsulation layer EC may be a layer that directly contacts the adhesive layer 20.

A protection film PF may be disposed below the substrate SUB to protect the display panel 10. A functional sheet such as a cushion layer, a heat dissipation sheet, a light blocking sheet, a water-proof tape, and the like may be disposed below the protection film PF.

Hereinabove, the display panel 10 has been described as an organic light emitting display panel, but the display panel 10 may be various display panels such as a display panel including a light emitting diode ("LED"), a display panel including a liquid crystal layer, and the like.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A method for manufacturing a display device, the method comprising:
    attaching an adhesive sheet to a rear side of a display panel;
    attaching a center area of the display panel to a window;
    attaching edge areas of the display panel to the window while a tension force is applied to the adhesive sheet; and
    removing the adhesive sheet.

2. The method for manufacturing the display device of claim 1, wherein, when the tension force is applied to the adhesive sheet, the adhesive sheet and the edges areas of the display panel attached to the adhesive sheet are stretched, and the edge areas of the display panel are attached to the window while being in a stretched state.

3. The method for manufacturing the display device of claim 1, wherein the attaching the center area of the display panel is carried out by a center pad, and the attaching the edge areas of the display panel is carried out by edge pads which are disposed at edges of the center pad.

4. The method for manufacturing the display device of claim 3, wherein the attaching the edge areas of the display panel is carried out by increasing a volume of the edge pads.

5. The method for manufacturing the display device of claim 3, wherein the edge pads have moduli which are smaller than that of the center pad.

6. The method for manufacturing the display device of claim 4, wherein at least one of the edge pads is a diaphragm of which the volume is changed depending on an air pressure.

7. The method for manufacturing the display device of claim 3, wherein the center pad includes a first pad and a second pad which surrounds the first pad,
   the attaching the center area of the display panel to the window includes attaching a first area of the center area by the first pad and then attaching a second area of the center area by the second pad.

8. The method for manufacturing the display device of claim 1, wherein the attaching the center area of the display panel to the window is carried out by a roll.

9. The method for manufacturing the display device of claim 1, wherein the center area of the display panel forms a flat display area, and the edge areas of the display panel form a curved display area which includes side display areas and corner display areas.

10. The method for manufacturing the display device of claim 9, wherein when the adhesive sheet is attached to the rear side of the display panel, the adhesive sheet is attached to the side display areas and is not attached to the corner display areas.

* * * * *